United States Patent
Westerhof et al.

(10) Patent No.: US 9,958,793 B2
(45) Date of Patent: May 1, 2018

(54) LITHOGRAPHIC APPARATUS, POSITIONING SYSTEM FOR USE IN A LITHOGRAPHIC APPARATUS AND METHOD

(71) Applicants: ASML Netherlands B.V., Veldhoven (NL); CARL ZEISS SMT GmbH, Oberkochen (DE)

(72) Inventors: Roan Marinus Westerhof, Veldhoven (NL); Hubertus Luberta Hagenaars, Veldhoven (NL); Ulrich Schönhoff, Ulm (DE); Adrianus Josephus Petrus Van Engelen, Veldhoven (NL)

(73) Assignees: ASML NETHERLANDS B.V., Veldhoven (NL); CARL ZEISS SMT GMBH, Oberkochen (DE)

( * ) Notice: Subject to any disclaimer, the term of this patent is extended or adjusted under 35 U.S.C. 154(b) by 0 days. days.

(21) Appl. No.: 14/897,503

(22) PCT Filed: Jun. 26, 2014

(86) PCT No.: PCT/EP2014/063483
§ 371 (c)(1),
(2) Date: Dec. 10, 2015

(87) PCT Pub. No.: WO2015/000777
PCT Pub. Date: Jan. 8, 2015

(65) Prior Publication Data
US 2016/0109814 A1   Apr. 21, 2016

Related U.S. Application Data

(60) Provisional application No. 61/842,180, filed on Jul. 2, 2013.

(51) Int. Cl.
*G03B 27/58* (2006.01)
*G03F 7/20* (2006.01)

(52) U.S. Cl.
CPC .......... *G03F 7/70775* (2013.01); *G03F 7/709* (2013.01); *G03F 7/70141* (2013.01); *G03F 7/70258* (2013.01); *G03F 7/70766* (2013.01)

(58) Field of Classification Search
CPC ............. G03F 7/70141; G03F 7/70258; G03F 7/70766; G03F 7/70775; G03F 7/709
(Continued)

(56) References Cited

U.S. PATENT DOCUMENTS 6,788,386 B2   9/2004   Cox et al.
7,333,179 B2   2/2008   Yuan et al.
(Continued)

FOREIGN PATENT DOCUMENTS

CN   1442755   9/2003
CN   101082783   12/2007
(Continued)

OTHER PUBLICATIONS

Chinese Office Action dated Aug. 29, 2016 in corresponding Chinese Patent Application No. 201480037053.9.
(Continued)

*Primary Examiner* — Peter B Kim
(74) *Attorney, Agent, or Firm* — Pillsbury Winthrop Shaw Pittman LLP (57) ABSTRACT

A lithographic apparatus having a reference body and a positioning system, the positioning system including a main body; a reaction body; an actuator; and a controller. The main body is moveable relative to the reference body along a path in a first direction and a second opposite direction. The reaction body is moveable relative to the main body along a further path in the first and second directions and is moveably connected to the reference body to be moveable relative to the reference body in the first and second directions. The controller provides a first and a second signal to
(Continued)

the actuator. The actuator is arranged between the main body and the reaction body to accelerate the main body in the first direction and to accelerate the reaction body in the second direction under control of the first signal, and to accelerate the main body in the second direction and to accelerate the reaction body in the first direction under control of the second signal. The controller determines when the reaction body moves in the second direction and to provide the second signal after the first signal to the actuator when the reaction body moves in the second direction along the further path.

11 Claims, 4 Drawing Sheets

(58) Field of Classification Search
USPC .................................................. 355/72, 75
See application file for complete search history.

(56) References Cited

U.S. PATENT DOCUMENTS

| | | | |
|---|---|---|---|
| 7,586,598 | B2 | 9/2009 | Plug et al. |
| 7,885,021 | B2 | 2/2011 | Van Deuren et al. |
| 8,730,451 | B2 | 5/2014 | Butler et al. |
| 2006/0033903 | A1 | 2/2006 | Yuan et al. |
| 2009/0040638 | A1 | 2/2009 | Van Deuren et al. |
| 2010/0089712 | A1 | 4/2010 | Butler et al. |
| 2012/0138401 | A1 | 6/2012 | Vogler et al. |
| 2012/0154774 | A1 | 6/2012 | Van Der Wijst et al. |

FOREIGN PATENT DOCUMENTS

| | | |
|---|---|---|
| CN | 102455607 | 5/2012 |
| CN | 102566308 | 9/2015 |
| JP | 2000-216082 | 8/2000 |
| JP | 2010-93253 | 4/2010 |
| JP | 2012-134486 | 7/2012 |
| NL | 2003424 | 4/2010 |
| WO | 2006/046101 | 5/2006 |

OTHER PUBLICATIONS

Japanese Office Action dated Sep. 26, 2016 in corresponding Japanese Patent Application No. 2016-522490.
International Search Report dated Sep. 26, 2014 in corresponding International Patent Application No. PCT/EP2014/063483.
Japanese Office Action dated May 31, 2017 in corresponding Japanese Patent Application No. 2016-522490.
Korean Office Action dated Mar. 10, 2017 in corresponding Korean Patent Application No. 10-2016-7001942.
Chinese Office Action dated Nov. 1, 2017 in corresponding Chinese Patent Application No. 201480037053.9.

LITHOGRAPHIC APPARATUS, POSITIONING SYSTEM FOR USE IN A LITHOGRAPHIC APPARATUS AND METHOD

CROSS-REFERENCE TO RELATED APPLICATIONS

This application is the U.S. National Stage of PCT/EP2014/063483, filed Jun. 26, 2014, which in turn claims the benefit of priority to U.S. provisional application Ser. No. 61/842,180, which was filed on Jul. 2, 2013, the entire contents of all applications are incorporated herein by reference in their entireties.

FIELD

The invention relates to a lithographic apparatus, a positioning system for use in a lithographic apparatus, and a method for limiting a magnitude of an excursion of a reaction body in a lithographic apparatus.

BACKGROUND

A lithographic apparatus is an apparatus that can be used in the manufacture of integrated circuits (ICs). In that instance, a patterning device, which is alternatively referred to as a mask or a reticle, may be used to generate a circuit pattern to be formed on an individual layer of the IC. This pattern can be transferred by a radiation beam via a projection system onto a target portion on a substrate, such as a silicon wafer. Transfer of the pattern is typically via imaging onto a layer of radiation-sensitive material provided on the substrate. In general, a single substrate will contain a network of adjacent target portions that are successively patterned. Known lithographic apparatus include so-called steppers, in which each target portion is irradiated by exposing an entire pattern onto the target portion at one time. Known lithographic apparatus also include so-called scanners, in which each target portion is irradiated by scanning the pattern through a radiation beam in a given direction while synchronously scanning the substrate parallel or anti parallel to this direction.

The projection system of a known lithographic apparatus has optical elements to transfer and shape the radiation beam. During use of the lithographic apparatus, the radiation beam may heat up part of the projection system, which may cause some of the optical elements to drift or deform. The drift or deformation may cause aberrations of the radiation beam that reduce the quality of the projected pattern on the substrate. To compensate for the drift or deformation, the position or orientation of some of these optical elements may be adjusted.

In a known lithographic apparatus, such as described in US2012/0138401 A1, hereby incorporated by reference, the projection system has an optical element, an inner ring, an outer ring surrounding the inner ring, and an actuator system. The optical element is rigidly connected to the inner ring. The actuator system is between the inner ring and the outer ring to displace or deform the optical element relative to the outer ring. To prevent the optical element from vibrating, a plurality of mass dampers is provided on the inner ring. Each mass damper has a damper mass that is connected to the inner ring via a spring-damper element. The combination of the damper mass and the spring-damper element forms a dynamical system having a natural frequency.

SUMMARY

The known lithographic apparatus may be improved. When the mass damper absorbs the energy of the vibrations of the optical element, the mass damper will start to vibrate in an eigenmode at the natural frequency. When the mass damper absorbs more energy, the magnitude of the excursion of the mass damper will increase. Because of volume limitations in the lithographic apparatus, the mass damper may hit a part of the lithographic apparatus, such as an end stop. Hitting the part causes vibrations of the lithographic apparatus, reducing the quality of the projected pattern on the substrate.

In an embodiment of the invention, there is provided a lithographic apparatus that provides an improved quality of the projected pattern on the substrate.

In a first aspect of the invention, there is provided a lithographic apparatus having a reference body and a positioning system. The positioning system comprises a main body, a reaction body, an actuator and a controller. The main body is moveable relative to the reference body along a path in a first direction and a second direction. The first direction is opposite to the second direction. The reaction body is moveable relative to the main body along a further path in the first direction and the second direction. The reaction body is moveably connected to the reference body so as to be moveable relative to the reference body in the first direction and the second direction. The controller is arranged to provide a first signal and a second signal to the actuator. The actuator is arranged between the main body and the reaction body so as to accelerate the main body in the first direction and to accelerate the reaction body in the second direction under control of the first signal, and so as to accelerate the main body in the second direction and to accelerate the reaction body in the first direction under control of the second signal. The controller is arranged to provide the second signal after the first signal to the actuator when the reaction body moves in the second direction along the further path.

According to the first aspect, the actuator accelerates the reaction body in the second direction under control of the first signal. The controller waits to provide the second signal to the actuator until the reaction body moves in the second direction. When the reaction body moves in the second direction, the actuator accelerates the reaction body in the first direction under control of the second signal. Since the movement of the reaction body in the second direction is opposite to the acceleration in the first direction, movement of the reaction body is reduced. The reduced movement limits the magnitude of the excursion of the reaction body. As a result, the chance that the reaction body hits any parts of the lithographic apparatus is reduced. When the reaction body does not hit any parts, the lithographic apparatus experiences less vibration, which results in an improvement of the quality of the pattern projected on the substrate.

In a first embodiment of the lithographic apparatus, the reference body and the reaction body connected to the reference body form a dynamic system having an eigenmode. The eigenmode is characterized by an oscillating movement of the reaction body relative to the reference body at least partly in the first direction and the second direction in the absence of an external driving force. The eigenmode has a corresponding period. The controller is arranged to provide the first signal and the second signal with a length of time between the first signal and the second signal. The length of time is determined by the corresponding period.

According to the first embodiment, the dynamic system of the reference body and the reaction body connected to the reference body has an eigenmode and a corresponding period. The corresponding period may depend on the mass of the reference body, the mass of the reaction body and the stiffness of the connection between the reference body and the reaction body. The corresponding period may be calculated or measured, for example, prior to using the lithographic apparatus. Using the corresponding period, the controller is able to determine when the reaction body moves in the second direction after the controller provided the first signal to the actuator.

In a second embodiment of the lithographic apparatus, the reaction body comprises a reaction mass and a flexible element. The flexible element moveably connects the reaction mass to the reference body.

According to the second embodiment, the corresponding period may be set to match a desired set-point of the main body. The set-point determines when the main body is to be accelerated in the first and second directions. The corresponding period may be set by selecting the amount of reaction mass and the stiffness and/or damping of the flexible element.

In a third embodiment of the lithographic apparatus, the flexible element is adjustable so as to select the corresponding period.

According to the third embodiment, the corresponding period may be set more accurately by adjusting the flexible element. By adjusting the flexible element, the stiffness or damping of the flexible element may be changed.

In a fourth embodiment of the lithographic apparatus, the lithographic apparatus comprises a projection system for projecting a radiation beam on a substrate. The main body is a part of the projection system.

According to the fourth embodiment, the projection system has parts which are actuated by an actuator. Such parts may comprise an optical element or a mount for an optical element. To prevent vibrations caused by the actuator to propagate through the lithographic apparatus, the reaction body is arranged to absorb at least part of the vibrational energy. As explained above, the reaction body will vibrated due to the absorbed energy. Since the projection system is a complex system in which many components are located close together, the space for the reaction body to vibrate is limited. In the first aspect, the reaction body may be used in a limited space without hitting any of the parts of the projection system.

In a fifth embodiment of the lithographic apparatus, the positioning system comprises a sensor for providing a sensor signal to the controller. The sensor signal is indicative of when the reaction body is moving in the second direction along the further path.

According to the fifth embodiment, movement of the reaction body is sensed by the sensor, such as an optical sensor or capacitive sensor. The sensor senses when the reaction body moves in the second direction and provides the sensor signal to the controller. Using the sensor signal, the controller is able to provide the second signal when the reaction mass moves in the second direction.

In a second aspect of the invention, there is provided a positioning system for use in the lithographic apparatus as described above.

In a third aspect of the invention, there is provided a method for limiting a magnitude of an excursion of a reaction body in a lithographic apparatus. The lithographic apparatus comprises a reference body, a main body and a reaction body. The main body is moveable relative to the reference body along a path in a first direction and a second direction. The first direction is opposite to the second direction. The reaction body is moveable relative to the main body along a further path in the first direction and the second direction. The reaction body is moveably connected to the reference body so as to be moveable relative to the reference body in the first and second direction. The method comprises accelerating the main body in the first direction and accelerating the reaction body in the second direction under control of a first signal. The method further comprises accelerating the main body in the second direction and the reaction body in the first direction under control of a second signal. The method further comprises providing the second signal after providing the first signal when the reaction body moves in the second direction along the further path.

According to the third aspect, the reaction body accelerates in the second direction under control of the first signal. The second signal to accelerate the reaction body in the first direction is provided when the reaction body moves in the second direction. Since the movement of the reaction body in the second direction is opposite to the acceleration in the first direction, movement of the reaction body is reduced. The reduced movement limits the magnitude of the excursion of the reaction body, and helps to prevent the reaction body from hitting any parts of the lithographic apparatus. When the reaction body does not hit any parts, the lithographic apparatus experiences fewer vibrations, which results in an improvement of the quality of the pattern projected on the substrate.

In an embodiment, the reference body and the reaction body connected to the reference body form a dynamic system having an eigenmode. The eigenmode is characterized by a movement of the reaction body relative to the reference body at least partly in the first direction and the second direction. The eigenmode has a corresponding period. The method comprises providing the first signal and the second signal with a length of time between the first signal and the second signal, wherein the length of time is determined by the corresponding period.

According to the embodiment, the dynamic system of the reference body and the reaction body connected to the reference body has an eigenmode and a corresponding period. The corresponding period may depend on the mass of the reference body, the mass of the reaction body and the stiffness of the connection between the reference body and the reaction body. The corresponding period may be calculated or measured, for example prior to using the lithographic apparatus. Using the corresponding period, the second signal may be provided when the reaction body moves in the second direction. As a result, the quality of the pattern projected on the substrate is improved, as explained at the first aspect of the invention.

In an embodiment, the method further comprises providing a sensor signal. The sensor signal is indicative for when the reaction body moves in the second direction along the further path.

According to the embodiment, movement of the reaction body is measured by a sensor, such as an optical or capacitive sensor. The sensor senses when the reaction body moves in the second direction and provides a sensor signal to the controller. Using the sensor signal, the second signal may be provided when the reaction mass moves in the second direction.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
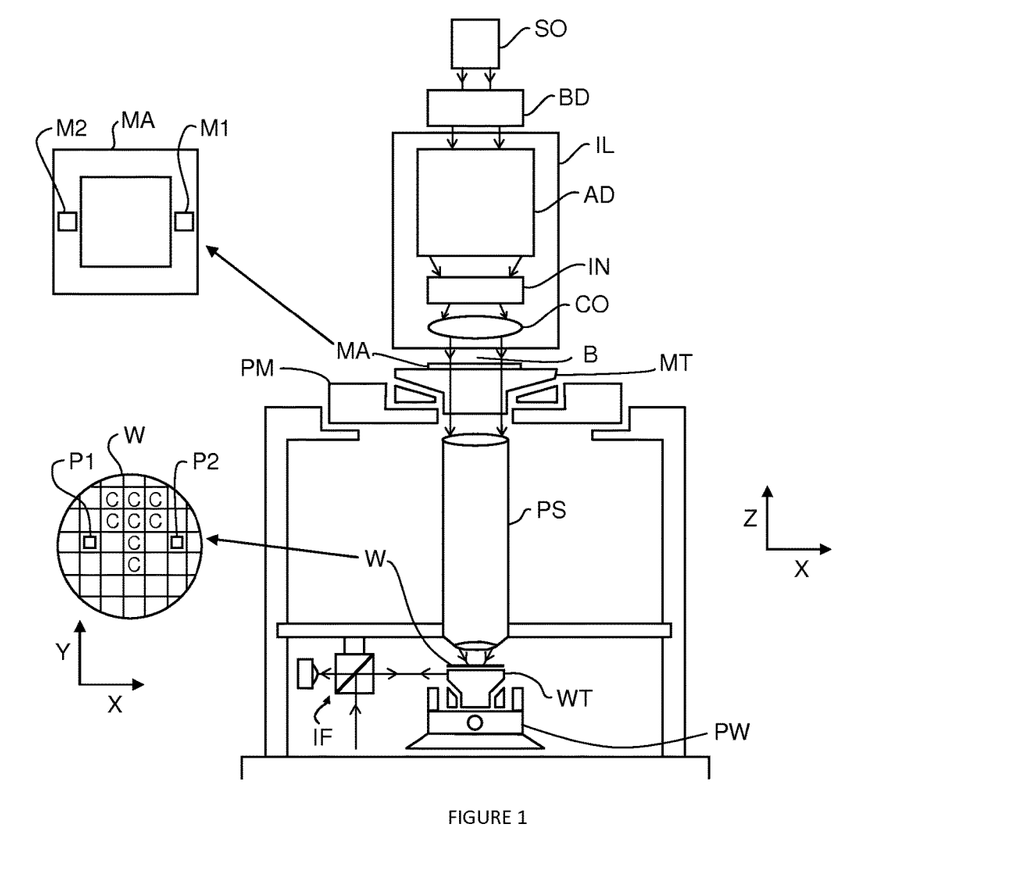
FIG. 1 depicts a lithographic apparatus according to an embodiment of the invention.

FIG. 1 schematically depicts a lithographic apparatus with a positioning system according to the invention. The apparatus may comprise an illumination system IL, a support structure MT or patterning device support, a substrate table WT and a projection system PS.

The illumination system IL is configured to condition a radiation beam B. The illumination system IL may include various types of optical components, such as refractive, reflective, magnetic, electromagnetic, electrostatic or other types of optical components, or any combination thereof, for directing, shaping, or controlling radiation.

The illumination system IL receives a radiation beam from a radiation source SO. The source and the lithographic apparatus may be separate entities, for example when the source is an excimer laser. In such cases, the source is not considered to form part of the lithographic apparatus and the radiation beam B is passed from the source SO to the illumination system IL with the aid of a beam delivery system BD comprising, for example, suitable directing mirrors and/or a beam expander. In other cases the source SO may be an integral part of the lithographic apparatus, for example when the source SO is a mercury lamp. The source SO and the illumination system IL, together with the beam delivery system BD if required, may be referred to as a radiation system.

The illumination system IL may comprise an adjuster AD for adjusting the angular intensity distribution of the radiation beam. In addition, the illumination system IL may comprise various other components, such as an integrator IN and a condenser CO. The illumination system may be used to condition the radiation beam B, to have a desired uniformity and intensity distribution in its cross section.

The term "radiation beam" used herein encompasses all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The support structure (e.g. a mask table) MT is for supporting a patterning device (e.g. a mask or reticle) MA. The support structure MT is connected to a first positioning system PM configured to accurately position the patterning device MA in accordance with certain parameters.

The support structure MT supports, i.e. bears the weight of the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device" used herein should be broadly interpreted as referring to any device that can be used to impart a radiation beam B with a pattern in its cross-section such as to create a pattern in a target portion C of the substrate W. It should be noted that the pattern imparted to the radiation beam B may not exactly correspond to the desired pattern in the target portion C of the substrate W, for example if the pattern includes phase-shifting features or so called assist features. Generally, the pattern imparted to the radiation beam B will correspond to a particular functional layer in a device being created in the target portion C, such as an integrated circuit.

The patterning device MA may be transmissive or reflective. Examples of a patterning device MA include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix. As here depicted, the apparatus is of a transmissive type, which employs a transmissive mask.

The substrate table WT, e.g. a wafer table, is for holding a substrate W, e.g. a resist coated wafer. The substrate table WT is connected to a second positioning system PW configured to accurately position the substrate W in accordance with certain parameters.

The projection system PS is configured to project a pattern imparted to the radiation beam B by patterning device MA onto a target portion C of the substrate W.

The term "projection system" used herein should be broadly interpreted as encompassing any type of projection system PS, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

The radiation beam B is incident on the patterning device MA, which is held on the support structure MT, and is patterned by the patterning device MA. Having traversed the patterning device MA, the radiation beam B passes through the projection system PS which focuses the radiation beam B onto a target portion C of the substrate W. With the aid of the second positioning system PW and position sensor IF (e.g. an interferometric device, linear encoder or capacitive sensor), the substrate table WT can be moved accurately, e.g. so as to position different target portions C in the path of the radiation beam B. Similarly, the first positioning system PM and another position sensor (which is not depicted in FIG. 1) can be used to accurately position the patterning device MA with respect to the path of the radiation beam B. In general, movement of the support structure MT may be realized with the aid of a long-stroke module and a short-stroke module. The long-stroke module provides coarse positioning of the short-stroke module relative to the projection system PS over a long range. The short-stroke module provides fine positioning of the patterning device MA relative to the long-stroke module over a small range. Similarly, movement of the substrate table WT may be realized using a long-stroke module and a short-stroke module, which form part of the second positioning system PW. In the case of a stepper (as opposed to a scanner) the support structure MT may be connected to a short-stroke actuator only, or may be fixed.

Patterning device MA and substrate W may be aligned using patterning device alignment marks M1, M2 and substrate alignment marks P1, P2. Although the substrate alignment marks P1, P2 as illustrated occupy dedicated target portions, they may be located in spaces between target portions C. Similarly, in situations in which more than one die is provided on the patterning device MA, the patterning device alignment marks M1, M2 may be located between the dies.

The lithographic apparatus may be of a type having two or more substrate tables WT and/or two or support structures MT. In addition to the at least one substrate table WT, the lithographic apparatus may comprise a measurement table, which is arranged to perform measurements but is not arranged to hold a substrate.

The lithographic apparatus may also be of a type wherein at least a portion of the substrate may be covered by a liquid having a relatively high refractive index, e.g. water, so as to fill a space between the projection system PS and the substrate W. An immersion liquid may also be applied to other spaces in the lithographic apparatus, for example, between the patterning device MA and the projection system PS. Immersion techniques are well known in the art for increasing the numerical aperture of projection systems. The term "immersion" as used herein does not mean that a structure, such as a substrate W, must be submerged in liquid, but rather only means that liquid is located between the projection system PS and the substrate W during exposure.

The depicted lithographic apparatus could be used in at least one of the following three modes:

In the first mode, the so-called step mode, the support structure MT and the substrate table WT are kept essentially stationary, while an entire pattern imparted to the radiation beam is projected onto a target portion C at one time. The substrate table WT is then shifted in the X and/or Y direction so that a different target portion C can be exposed.

In the second mode, the so-called scan mode, the patterning device MT and the substrate table WT are scanned synchronously while a pattern imparted to the radiation beam is projected onto a target portion C. The velocity and direction of the substrate table WT relative to the patterning device MT may be determined by the (de-)magnification and image reversal characteristics of the projection system PS.

In the third mode, the patterning device MT is kept essentially stationary holding a programmable patterning device MA, and the substrate table WT is moved or scanned while a pattern imparted to the radiation beam B is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device MA, such as a programmable mirror array of a type as referred to above.

Combinations and/or variations on the above described modes of use or entirely different modes of use may also be employed.

Figure 2:
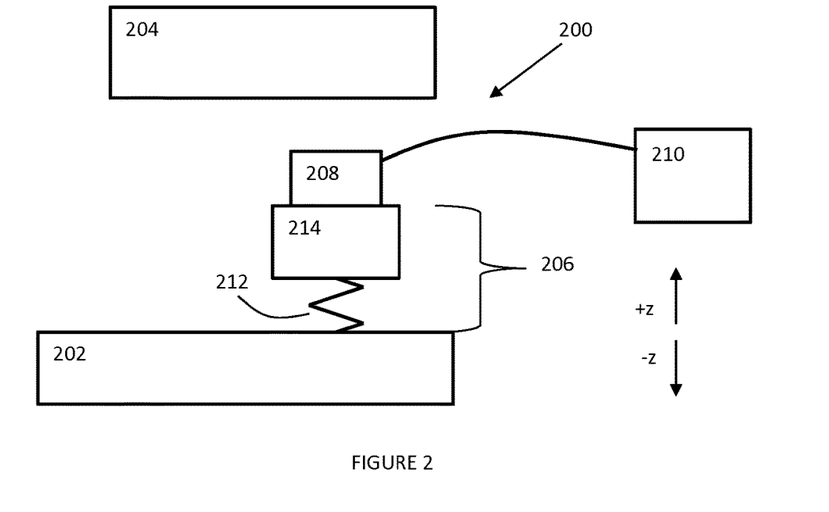
FIG. 2 depicts a diagram of the positioning system of the lithographic apparatus according to an embodiment of the invention.

FIG. 2 depicts a diagram of a positioning system 200 of the lithographic apparatus according to an embodiment of the invention. The positioning system 200 comprises a main body 204, an actuator 208, a reaction body 206 and a controller 210.

The main body 204 is moveable relative to the reference body 202. In this embodiment, the main body 204 and the reference body 202 can move in the +z direction and in the −z direction relative to each other along a path. The +z direction can be considered to be a first direction, the −z direction can be considered to be a second direction, opposite to the first direction. The path may include movement of the main body 204 relative to the reference body 202 in other directions than the +z direction and the −z direction.

The reaction body 206 is moveable relative to the main body 204 along a further path in the +z direction and the −z direction. The further path may include movement of the reaction body 206 relative to the main body 204 in other directions than the +z direction and the −z direction.

The reaction body 206 is moveably connected to the reference body 202 so as to be moveable relative to the reference body 202 in the +z direction and the −z direction. In this embodiment, the reaction body 206 comprises a reaction mass 214 and a flexible element 212. The flexible element 212 connects the reaction mass 214 to the reference body 202. The flexible element 212 is flexible so as to allow movement of the reaction mass 214 relative to the reference body 202. The flexible element 212 may comprise at least one of a flexible material and a flexible shape, such as a spring.

The controller 210 is connected to the actuator 208. The controller 210 is arranged to provide a first signal to the actuator 208. The actuator 208 is arranged between the main body 204 and the reaction body 206 so as to accelerate the main body 204 in the +z direction and to accelerate the reaction body 206 in the −z direction under control of the first signal. In this embodiment, the actuator 208 is connected to the reaction body 206. Under control of the first signal, the actuator 208 is arranged to generate a force to push the main body 204 in the +z direction. The force causes the main body 204 to accelerate in the +z direction. Simultaneously with the force, a reaction force is generated that pushes the actuator in the −z direction. Since the actuator is connected to the reaction body 206, the reaction body 206 is pushed by the actuator 208 and the reaction body 206 accelerates in the −z direction under control of the first signal.

The controller 210 is arranged to provide a second signal to the actuator 208. Under control of the second signal, the actuator 208 pulls the main body 204 in the −z direction. The force causes the main body 204 to accelerate in the −z direction. Simultaneously with the force, a reaction force is generated that pulls the actuator 208 in the +z direction. Since the actuator 208 is connected to the reaction body 206, the reaction body 206 is pulled by the actuator and the reaction body 206 accelerates in the +z direction under control of the second signal.

The controller 210 is arranged to provide the second signal after the first signal to the actuator 208 when the reaction body 206 moves in the −z direction. This way, the controller 210 is able to limit the magnitude of the excursion of the reaction body 206 in the −z direction and the +z direction.

Instead of being connected to the reaction body 206, the actuator 208 may be connected to the main body 204. In an embodiment, a part of the actuator 208 is connected to the reaction body 206 whereas another part of the actuator 208 is connected to the main body 204. For example, a magnet of the actuator 208 is connected to the reaction body 206 and a coil of the actuator 208 is connected to the main body 204, or vice versa.

The controller 210 may be any suitable type of controller, micro-processor or micro-controller.

It may be clear to the skilled person that the direction of the +z direction and the −z direction as shown in FIG. 2 is for illustrative purposes only. The +z direction and the −z direction may be reversed, or may be orientated differently.

The reference body 202 and the reaction body 206, the latter being connected to the reference body 202, may form a dynamic system. The dynamic system may have an eigenmode in which the reaction body 206 moves relative to the reference body 202 at least partly in the +z direction and the −z direction. The movement of the reaction body 206 in the eigenmode may occur at a certain frequency, i.e., the natural frequency of the dynamic system. The natural frequency is the inverse of a period corresponding to the eigenmode. The corresponding period is the time it takes the reaction body 206 to make a complete cycle of movement according to the eigenmode. The cycle of movement may be complete when the reaction body 206 is at a certain position and velocity relative to the reference body 202 that are the same as the position and velocity at the beginning of the cycle of movement.

When the controller 210 provides the first signal to the actuator 208, the actuator 208 applies a force to the reaction body 206. The application of the force may cause the reaction body 206 to vibrate according to the eigenmode. If the controller 210 is provided with the natural frequency or the corresponding period, the controller 210 is able to predict when the reaction body 206 is moving in the +z direction. The controller 210 may be programmed to wait a length of time after providing the first signal to the actuator 208 before providing the second signal to the actuator 208. The length of time is determined by the corresponding period.

The eigenmode and corresponding period may be determined by the reaction mass 214 and the flexible element 212. By selecting a combination of a certain amount of mass of the reaction mass 214 and a certain amount of stiffness and/or damping of the flexible element 212, the eigenmode and corresponding period may be set. The flexible element 212 may be adjustable to change the stiffness and/or the damping. By adjusting the flexible element 212, the corresponding period may be set more accurately.

In an embodiment, the reaction body 206 comprises a plurality of flexible elements 212 and a plurality of reaction masses 214. For example, flexible element 212 may be connected to the reference body 202 and the reaction mass 214. A further flexible element may be connected to the reaction mass 214 and a further reaction mass. The actuator 208 may be connected to the further reaction mass. The number of flexible elements and reaction masses may be selected to optimize the dynamical behavior of the reaction body 206.

Figure 3:
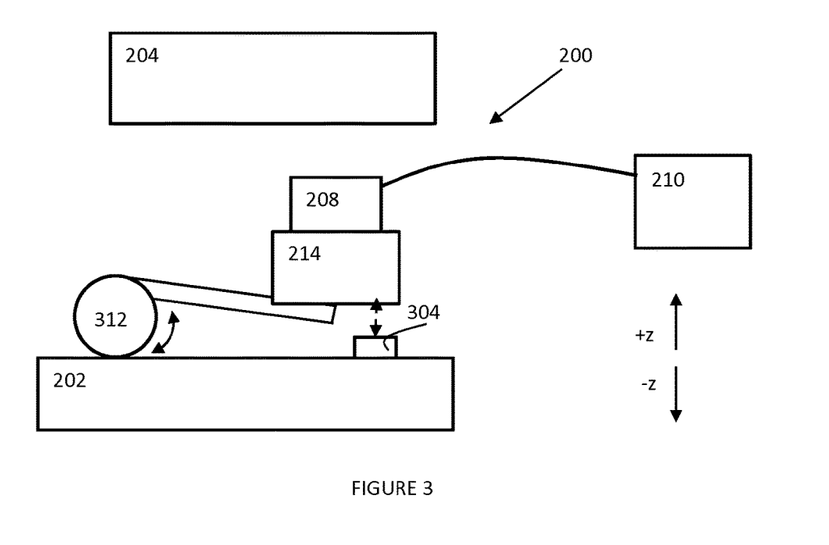
FIG. 3 depicts a diagram of the positioning system of the lithographic apparatus according to a further embodiment the invention.

The reaction body 206 as indicated in FIG. 2 is linearly moveable in the +z direction and the −z direction. FIG. 3 shows an embodiment similar to the embodiment of FIG. 2, but in which the reaction body comprises a rotatable flexible element 312 instead of the flexible element 212. The rotatable flexible element 312 is rotatable as indicated by the double-headed arrow. The reaction mass 214, which forms part of the reaction body 206, is connected to the rotatable flexible element 312. When the rotatable flexible element 312 rotates only a small amount, the movement of the reaction mass 214 is substantially in the +z direction and the −z direction In an embodiment, the positioning system 200 is provided with a sensor 304, as shown in FIG. 3. The sensor 304 is arranged to determine when the reaction body 206 is moving in the −z direction. The sensor 304 is connected, for example by a wire or wireless, to the controller. When the sensor 304 determines that the reaction body 206 moves in the −z direction, the sensor provides a sensor signal to the controller 210. When receiving the sensor signal, the controller 210 is able to determine when to provide the second signal to the actuator 208. The sensor 304 may comprise a position sensor which determines the position of the reaction body 206 relative to the reference body 202. The sensor may comprise a velocity sensor or an acceleration sensor. By integrating the sensor signal of the acceleration sensor or by differentiating the sensor signal of the position sensor, the movement of the reaction body 206 can be determined. The sensor 304 may comprise any suitable type of sensor, for example an optical sensor such as an encoder-type sensor or an interferometer. The sensor may comprise a capacitive sensor or an inductive sensor.

In an embodiment, the main body 204 is part of the projection system PS, for example an optical element or a mount for supporting an optical element. In the embodiment, the reference body may be a frame. The part may be moved relative to the frame. A position measurement system may measure a position of the part relative to the frame. The frame may support one or more optical elements or one or more mounts for optical elements. An optical element may be a mirror or a lens.

In an embodiment, the positioning system 200 may be used in the first positioning system PM or the second positioning system PW. The main body 204 may be part of the support structure MT or the main body 204 may be part of the substrate table WT. The main body 204 may be part of the short-stroke module and the reference body 202 may be part of the long-stroke module.

In an embodiment, the main body 204 is part of the first positioning system PM and the reference body 202 is part of a metrology frame supporting the projection system PS. In an embodiment, the main body 204 is part of the second positioning system PW and the reference body 202 is part of a metrology frame supporting the projection system PS.

Figure 4:
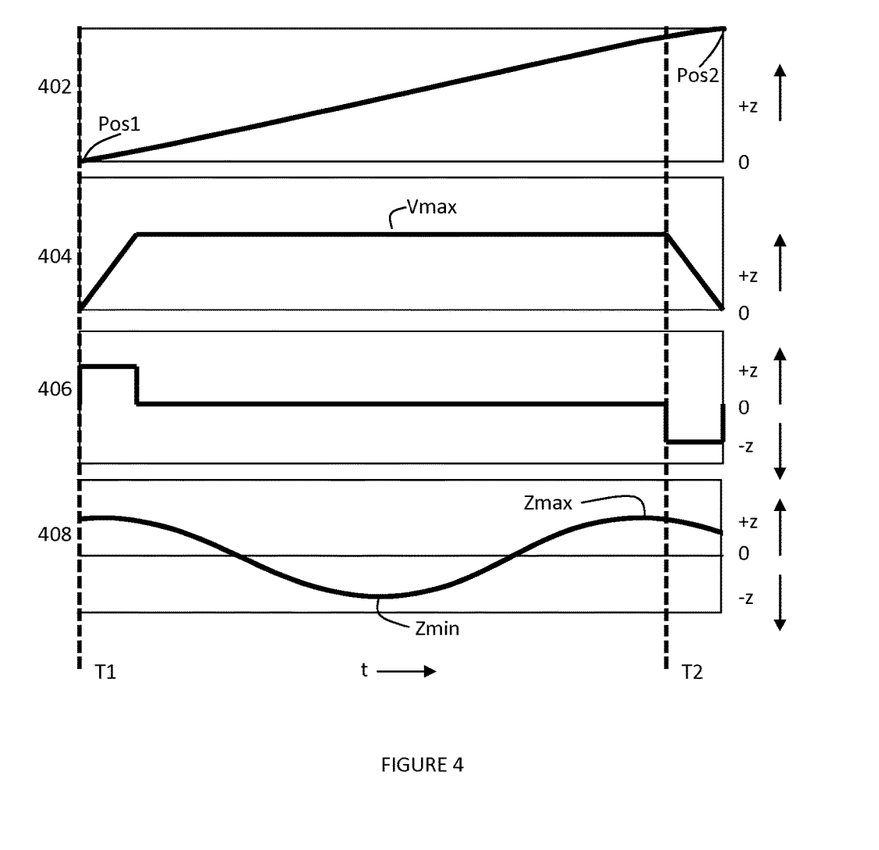
FIG. 4 depicts graphs showing movement of the main body and the reaction body according to an embodiment of the invention.

FIG. 4 depicts four graphs showing movement of the main body 204 and the reaction body 206 according to an embodiment of the invention. The graph 402 shows the position of the main body 204 as a function of time t. The main body 204 is moving from a starting position Pos1 at time T1 to an end position Pos2. As shown in the graph 402, the movement is in the +z direction. The graph 404 shows the velocity of the main body 204 during the movement. The graph 404 shows that the velocity at time T1 is zero. After time T1, the velocity is increased until a maximum velocity Vmax is reached. The maximum velocity Vmax is maintained until time T2. At time T2, the velocity is reduced. The velocity is zero when the main body 204 reaches the end position Pos2. The graph 406 shows the acceleration profile of the main body 204. At time T1, the main body 204 is accelerated in the +z direction until the main body 204 reaches the maximum velocity Vmax. When the main body 204 reaches the maximum velocity Vmax, the acceleration is zero. At time T2, the main body 204 is accelerated in the −z direction to reduce the velocity to zero.

The graph 408 shows the position of the reaction body 206 as a function of time t and corresponding to a movement of the reaction body 206 relative to the reference body 202 in the eigenmode. The movement is illustrated, for the sake of clarity, as a sine-shaped movement in the +z direction and the −z direction. At time T1, the acceleration of the main body 204 in the +z direction causes the reaction body 206 to accelerate in the −z direction. After time T1, the reaction body 206 initially moves in the −z direction. When the reaction body 206 reaches a minimum z-position Zmin, the reaction body 206 starts to move in the +z direction, and completes the cycle of movement of the sine-shaped movement. At time T2, the reaction body 206 has passed a maximum z-position Zmax and is moving in the −z direction. At time T2, the controller 210 provides the second signal to the actuator 208. The actuator 208 accelerates the main body 204 in the −z direction. The reaction force of the actuator 208 accelerates the reaction body 206 in the +z direction, which is opposite to the direction of the velocity of the reaction body 206 in the −z direction. The magnitude of the movement of the reaction body 206 is reduced as a result.

The graphs 402, 404 and 406 describe a set-point, i.e., a trajectory, of the main body 204. The set-point may comprise higher order derivatives of the acceleration, such as jerk, snap or crackle. Jerk is the time derivative of the acceleration, snap is the time derivative of the jerk, and crackle is the time derivative of the snap. To accelerate the main body 204, one or both of the first signal and the second signal from the controller 210 may initiate a change of a higher order derivative of the acceleration. At one of time T1 and time T2, a change of a higher order derivative of the acceleration may start.

In FIG. 4, the velocity and the acceleration reach a maximum value. Depended on the desired set-point and the type of actuator 208, the velocity and/or the acceleration may not reach a maximum, but may continue to increase and/or decrease.

In graph 408, the shown movement of the reaction body 206 is about one cycle of movement. In an embodiment, there are a plurality of such cycles of movement between time T1 and time T2. The second signal may be given at any time T2 when the reaction body 206 is moving in the −z direction.

Figure 5:
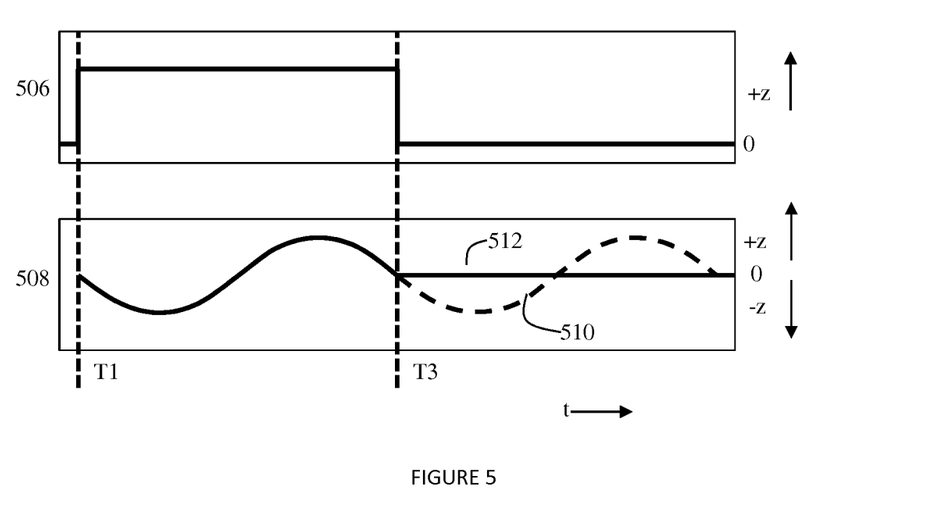
FIG. 5 depicts graphs showing acceleration of the main body and movement of the reaction body according to an embodiment of the invention.

The following embodiment is similar to the embodiments previously described, except for what is stated below. In the embodiment the actuator 208 generates a force to accelerate the main body 204 according to the acceleration profile 506 as depicted in FIG. 5. The actuator 208 accelerates the main body 204 in the +z direction from time T1 till T3. The acceleration before time T1 and after time T3 is zero.

The corresponding period of the reaction body 206 is set to be substantially the same as the time period between T1 and T3, as depicted in graph 508 in FIG. 5. When the actuator 208 receives at time T1 the first signal from the controller 210 to accelerate the main body 204 in the +z direction, the reaction body 206 is accelerated by the actuator 208 in the −z-direction. At time T3, the reaction body 206 moves in the −z direction since the reaction body 206 has completed a cycle of movement according to the eigenmode that corresponds to the corresponding period. When the reaction body is moving in the −z direction, the actuator 208 reduces the acceleration of the main body 204 by reducing the force that accelerates the main body 204 in the +z direction. The actuator 208 reduces the force under control of a third signal from the controller 210. If the third signal would not be provided to the actuator 208, the reaction body 206 would continue to move according to the dashed line 510 in graph 508. The dashed line indicates a movement of the reaction body 206 according to an eigenmode of the reaction body 206. However, since the acceleration of the main body 204 is reduced at time T3, the movement of the reaction body 206 is as indicated by a solid line 512. As depicted by the solid line 512, the excursion of the reaction body 206 after T3 is reduced to be smaller than the excursion of the reaction body 206 between time T1 and time T3. The excursion of the reaction body 206 after time T3 may be zero. Reducing the excursion of the reaction body 206 after time T3 prevents the reaction body 206 from hitting any parts of the lithographic apparatus.

In addition or alternatively, the third signal from the controller 210 may be used to reduce the acceleration of the main body 204 in the −z direction. In an embodiment, the time period between time T1 and time T3 is a plurality of corresponding periods instead of a single corresponding period.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate W and develops the exposed resist), a metrology tool and/or an inspection tool. Further, the substrate W may be processed more than once, for example in order to create a multi-layer IC, so that the term substrate W used herein may also refer to a substrate W that already contains multiple processed layers.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

What is claimed is:

1. A lithographic apparatus having a reference body and a positioning system, the positioning system comprising:
    a main body;
    a reaction body;
    an actuator; and
    a controller;
    wherein the main body is moveable relative to the reference body along a path in a first direction and a second direction, wherein the first direction is opposite to the second direction,
    wherein the reaction body is moveable relative to the main body along a further path in the first direction and the second direction,
    wherein the reaction body is moveably connected to the reference body so as to be moveable relative to the reference body in the first direction and the second direction, wherein the controller is arranged to provide a first signal and a second signal to the actuator, wherein the actuator is arranged between the main body and the reaction body so as to accelerate the main body in the first direction and to accelerate the reaction body in the second direction under control of the first signal, and so as to accelerate the main body in the second direction and to accelerate the reaction body in the first direction under control of the second signal, wherein the controller is arranged to determine when the reaction body moves in the second direction, and wherein the controller is arranged to provide the second signal after the first signal to the actuator when the reaction body moves in the second direction along the further path.

2. The lithographic apparatus of claim 1, wherein the reference body and the reaction body connected to the reference body form a dynamic system having an eigenmode, wherein the eigenmode is characterized by a movement of the reaction body relative to the reference body at least partly in the first direction and the second direction, wherein the eigenmode has a corresponding period, and wherein the controller is arranged to provide the first signal and the second signal with a length of time between the first signal and the second signal, wherein the length of time is determined by the corresponding period.

3. The lithographic apparatus of claim 2, wherein the reaction body comprises a reaction mass and a flexible element, wherein the flexible element moveably connects the reaction mass to the reference body.

4. The lithographic apparatus of claim 3, wherein the flexible element is adjustable so as to select the corresponding period.

5. The lithographic apparatus of claim 1, comprising a projection system for projecting a radiation beam on a substrate, wherein the main body is a part of the projection system.

6. The lithographic apparatus of claim 1, wherein the positioning system comprises a sensor for providing a sensor signal to the controller, the sensor signal being indicative of when the reaction body is moving in the second direction along the further path.

7. A positioning system for use in a lithographic apparatus having a reference body, the positioning system comprising:
a main body;
a reaction body;
an actuator; and
a controller;
wherein the main body is moveable relative to the reference body along a path in a first direction and a second direction, wherein the first direction is opposite to the second direction,
wherein the reaction body is moveable relative to the main body along a further path in the first direction and the second direction,
wherein the reaction body is moveably connectable to the reference body so as to be moveable relative to the reference body in the first direction and the second direction, wherein the controller is arranged to provide a first signal and a second signal to the actuator, wherein the actuator is arranged between the main body and the reaction body so as to accelerate the main body in the first direction and to accelerate the reaction body in the second direction under control of the first signal, and so as to accelerate the main body in the second direction and to accelerate the reaction body in the first direction under control of the second signal, wherein the controller is arranged to determine when the reaction body moves in the second direction, and wherein the controller is arranged to provide the second signal after the first signal to the actuator when the reaction body moves in the second direction along the further path.

8. The positioning system of claim 7, comprising a sensor for providing a sensor signal to the controller, the sensor signal being indicative of when the reaction body is moving in the second direction along the further path.

9. A method for limiting a magnitude of an excursion of a reaction body in a lithographic apparatus, wherein the lithographic apparatus comprises a reference body, a main body and a reaction body,
wherein the main body is moveable relative to the reference body along a path in a first direction and a second direction, wherein the first direction is opposite to the second direction,
wherein the reaction body is moveable relative to the main body along a further path in the first direction and the second direction,
wherein the reaction body is moveably connected to the reference body so as to be moveable relative to the reference body in the first and second direction, the method comprising:
accelerating the main body in the first direction and accelerating the reaction body in the second direction under control of a first signal;
accelerating the main body in the second direction and the reaction body in the first direction under control of a second signal;
providing the second signal after providing the first signal when the reaction body moves in the second direction along the further path.

10. The method of claim 9, wherein the reference body and the reaction body connected to the reference body form a dynamic system having an eigenmode,
wherein the eigenmode is characterized by a movement of the reaction body relative to the reference body at least partly in the first direction and the second direction, and
wherein the eigenmode has a corresponding period, the method comprising:
providing the first signal and the second signal with a length of time between the first signal and the second signal, wherein the length of time is determined by the corresponding period.

11. The method of claim 9, comprising:
providing a sensor signal, the sensor signal being indicative for when the reaction body moves in the second direction along the further path.

* * * * *